(12) United States Patent
Osterwald et al.

(10) Patent No.: US 11,400,514 B2
(45) Date of Patent: Aug. 2, 2022

(54) SINTERING TOOL AND METHOD FOR SINTERING AN ELECTRONIC SUBASSEMBLY

(71) Applicant: DANFOSS SILICON POWER GMBH, Flensburg (DE)

(72) Inventors: Frank Osterwald, Kiel (DE); Martin Becker, Kiel (DE); Lars Paulsen, Hollingstedt (DE); Jacek Rudzki, Kiel (DE); Holger Ulrich, Eisendorf (DE); Ronald Eisele, Surendorf (DE)

(73) Assignee: Danfoss Silicon Power GmbH, Flensburg (DE)

( * ) Notice: Subject to any disclaimer, the term of this patent is extended or adjusted under 35 U.S.C. 154(b) by 102 days.

(21) Appl. No.: 17/060,373

(22) Filed: Oct. 1, 2020

(65) Prior Publication Data
US 2021/0016353 A1    Jan. 21, 2021

Related U.S. Application Data

(62) Division of application No. 15/514,571, filed as application No. PCT/EP2015/070625 on Sep. 9, 2015, now Pat. No. 10,814,396.

(30) Foreign Application Priority Data

Sep. 29, 2014   (DE) .......................... 102014114097.4

(51) Int. Cl.
| | |
|---|---|
| *B23K 3/00* | (2006.01) |
| *B22F 3/14* | (2006.01) |
| *H01L 23/00* | (2006.01) |
| *B22F 5/00* | (2006.01) |

(52) U.S. Cl.
CPC .................. *B22F 3/14* (2013.01); *B22F 5/00* (2013.01); *H01L 24/75* (2013.01); *H01L 24/83* (2013.01); *B22F 2998/10* (2013.01); *H01L 2224/32225* (2013.01); *H01L 2224/7532* (2013.01); *H01L 2224/75315* (2013.01); *H01L 2224/75316* (2013.01); *H01L 2224/75317* (2013.01); *H01L 2224/75318* (2013.01); *H01L 2224/75821* (2013.01); *H01L 2224/8384* (2013.01); *H01L 2224/83203* (2013.01); *H01L 2924/00014* (2013.01)

(58) Field of Classification Search
CPC .. B23K 20/025; B23K 20/023; B23K 1/0008; B23K 1/19
See application file for complete search history.

(56) References Cited

U.S. PATENT DOCUMENTS

| | | | |
|---|---|---|---|
| 5,074,533 A | 12/1991 | Frantz | |
| 5,352,629 A * | 10/1994 | Paik | ........................ H01L 24/75 228/123.1 |
| 6,383,446 B1 | 5/2002 | Tokita | |
| 9,688,060 B2 * | 6/2017 | Bayerer | ................ H01L 25/072 |
| 9,956,643 B2 * | 5/2018 | Matsubayashi | ...... B23K 1/0016 |
| 10,037,903 B2 * | 7/2018 | Matsubayashi | ... H01L 21/67092 |

(Continued)

*Primary Examiner* — Erin B Saad
(74) *Attorney, Agent, or Firm* — McCormick, Paulding & Huber PLLC

(57) ABSTRACT

Sintering tool (10) with a cradle for receiving an electronic subassembly (BG) to be sintered, characterized by at least one support bracket (20), arranged at two locations opposite the cradle, for fixing a protective film (30) covering the electronic subassembly (BG).

14 Claims, 3 Drawing Sheets

(56) References Cited

U.S. PATENT DOCUMENTS

| | | |
|---|---|---|
| 10,083,844 B2 * | 9/2018 | Matsubayashi ......... H01L 24/83 |
| 2002/0045144 A1 | 4/2002 | Mori et al. |
| 2003/0027371 A1 * | 2/2003 | Sunagawa ......... H01L 21/67132 |
| | | 257/E21.503 |
| 2004/0063058 A1 | 4/2004 | Orbeck et al. |
| 2005/0277244 A1 | 12/2005 | Galster et al. |
| 2010/0090328 A1 | 4/2010 | Goebl et al. |
| 2012/0247664 A1 * | 10/2012 | Kobayashi .............. H01L 24/75 |
| | | 156/308.2 |
| 2014/0127072 A1 | 5/2014 | Chen et al. |
| 2015/0243417 A1 | 8/2015 | Sun |
| 2015/0257280 A1 | 9/2015 | Ciliox et al. |
| 2017/0221852 A1 | 8/2017 | Osterwald et al. |
| 2017/0229418 A1 * | 8/2017 | Osterwald ................ H01L 24/75 |
| 2020/0114583 A1 | 4/2020 | Wen et al. |

\* cited by examiner

SINTERING TOOL AND METHOD FOR SINTERING AN ELECTRONIC SUBASSEMBLY

CROSS-REFERENCE TO RELATED APPLICATIONS

This application is a divisional of U.S. patent application Ser. No. 15/514,571, filed Mar. 27, 2017, which is a National Stage application of International Patent Application No. PCT/EP2015/070625, filed on Sep. 9, 2015, which claims priority to German Patent Application No. 102014114097.4, filed on Sep. 29, 2014, each of which is hereby incorporated by reference in its entirety.

TECHNICAL FIELD

The invention relates to a sintering tool with a cradle for receiving an electronic subassembly to be sintered. The invention also relates to a method for sintering an electronic subassembly comprising the steps of: arranging the electronic subassembly on the cradle of a sintering tool, covering the electronic subassembly with a protective film, and sintering the electronic subassembly.

BACKGROUND

Sintering devices for carrying out the low-temperature pressure sintering of electronic subassemblies are already known. These have an upper die and a (preferably heatable) lower die, which can be moved towards one another. In particular, such sintering devices are designed for sintering electronic subassemblies in such a way that a lower die is provided with a massive tool, which carries and heats the planar circuit carrier. A temperature-resistant elastic medium of the upper die tool in the form of a pressure pad, for example a silicone pad, produces an increasing pressure on the surface of the circuit carrier, whereby the latter is pressed onto the planar support of the lower die tool.

If a silicone pad is used as the pressure pad, it is customary to cover the subassembly to be sintered with a protective film, for example a Teflon film, in order to avoid contamination of the electronic subassembly with silicone components. The protective film is placed between the upper die and the lower die, covering the electronic subassembly to be sintered, and is elastically deformable in such a way that as the pressure pad presses the Teflon film against the surface contour of the electronic subassembly, so that the latter adapts itself to the surface relief of the electronic subassembly under elevated pressure (up to approximately 30 MPa) and elevated temperature (up to approximately 350° C.).

However, it has been found to be disadvantageous when using these protective films, that the protective film remains adapted to the contour of the electronic subassembly after the opening of the upper die and lower and the cooling down of the sintered electronic subassembly, and has to be carefully lifted off from the subassembly relief to avoid damage to the sintered electronic subassembly.

SUMMARY

The object of the invention is therefore to provide a sintering tool and a method for sintering that facilitates the sintering operation, in particular the handling of the protective film.

This object is achieved according to the invention by the tool for a sintering device comprising: a sintering tool with a cradle for receiving an electronic subassembly (BG) to be sintered, comprising at least one support bracket, arranged at two locations opposite the cradle, for fixing a protective film covering the electronic subassembly (BG) and the method comprising the steps of: a method for sintering an electronic subassembly (BG) comprising the steps of: arranging the electronic subassembly (BG) on the cradle of a sintering tool, covering the electronic subassembly (BG) with a protective film, and sintering the electronic subassembly (BG), whereby after the covering and before the sintering of the electronic subassembly (BG), the protective film is fixed to at least one support bracket which is in turn fixed at two locations on opposing sides of the cradle. The subclaims, which are respectively dependent on the independent claims, provide advantageous designs of the invention.

The basic concept of the invention is to fix the protective film at its edges, or the edges of the cradle, or of the electronic subassembly, before the heating and the application of pressure. On account of the elastic properties of the protective film, although the protective film will deform to adapt to the relief of the subassembly under the effect of heat and the effect of pressure, it will contract during the cooling down once sintering has been performed, and withdraw itself of its own accord from the surface relief, so that this operation takes place automatically and no longer has to be carried out manually.

The advantage of the invention is therefore that the protective film detaches itself of its own accord from the subassembly after the lifting off of the upper die and cooling down, and can be readily lifted off from the subassembly.

The sintering tool designed according to the invention has a cradle for receiving an electronic subassembly to be sintered and at least one support bracket, fixed at two locations on opposing sides of the cradle, for fixing a protective film covering the electronic subassembly.

Preferably, two sets of fixing points for the support bracket are provided, co-planarly arranged on either side of the cradle, and in orthogonal directions. A particularly advantageous design being achieved if the support bracket is of an annular form.

The support bracket can optionally also be rectangular, elliptical, or formed as a polygon to provide an optimized use of space of the cradle. Advantageously, the support bracket is formed complementary in shape to an edge of the cradle.

Easy fastening of the protective film to the sintering tool, the sintering tool preferably has a socket for receiving a connector formed on the support bracket. Specifically, the socket and the connector may be formed in the manner of a bayonet fastener.

Advantageously a release device may be provided, by means of which the separation of the sintering tool, in particular of the support bracket, from the protective film, may be carried out by the upper die after a pressurization and a sintering process. The electronic subassembly is usually set loosely on a moveable lower die and is pressed against an upper die comprising a pressure pad. The pressure pad is usually made of silicone, wherein the protective film protects the electronic subassembly from sticking and contamination by silicone. After the sintering, the lower die moves down and away from the fixed upper die, with the risk that the protective film, and possibly the electronic subassembly, adheres to the pressure pad of the upper die. To ensure safe release of the protective film, and possibly the electronic subassembly, from the pressure pad, a release device, coming from the upper die of the sintering tool, preferably engages into receiving sockets of the support bracket in order to release the sintering mold from upper die. Such a release device may comprise, for example, two or more electrically, pneumatically or hydraulically moveable actuator bolts. Herby it is possible to obtain a safe detachment of the electronic subassembly and thus a trouble-free and efficient sintering process.

The method concerning the invention for sintering an electronic subassembly then provides that the electronic subassembly is arranged on the cradle of a sintering tool, is covered with a protective film, and is sintered, the protective film being fixed to at least one support bracket which is in turn fixed at two locations on opposing sides of the cradle.

Optionally, the protective film may be mechanically detached after sintering.

According to a preferred embodiment, the protective film is fixed after the covering of the electronic subassembly by a clamping ring.

The protective film is in particular a Teflon film.

The protective film may be of a multi-layered or multi-ply construction, the one layer or ply of the protective film consisting of Teflon and another layer or ply consisting of Kapton. The Teflon layer or ply may, for example, have a thickness of 400 μm and the layer or ply of Kapton that is facing the electronic subassembly may be 50 μm thick, so that the risk of contamination of the electronic subassembly with Teflon is reduced.

Most preferably, the protective film is formed such that a gas exchange through the protective film is ensured—this is made possible by means of pores or holes penetrating the protective film. The clearances provided in the protective film allow an evacuation of the area surrounding the process, without inclusions of air remaining between the Teflon film and the components, or exposure to process gases, which can be brought up to the components to be sintered through these clearances, holes or pores.

BRIEF DESCRIPTION OF THE DRAWINGS

The invention is explained in more detail on the basis of an exemplary embodiment that is represented in the following figures.

DETAILED DESCRIPTION

Figure 1:
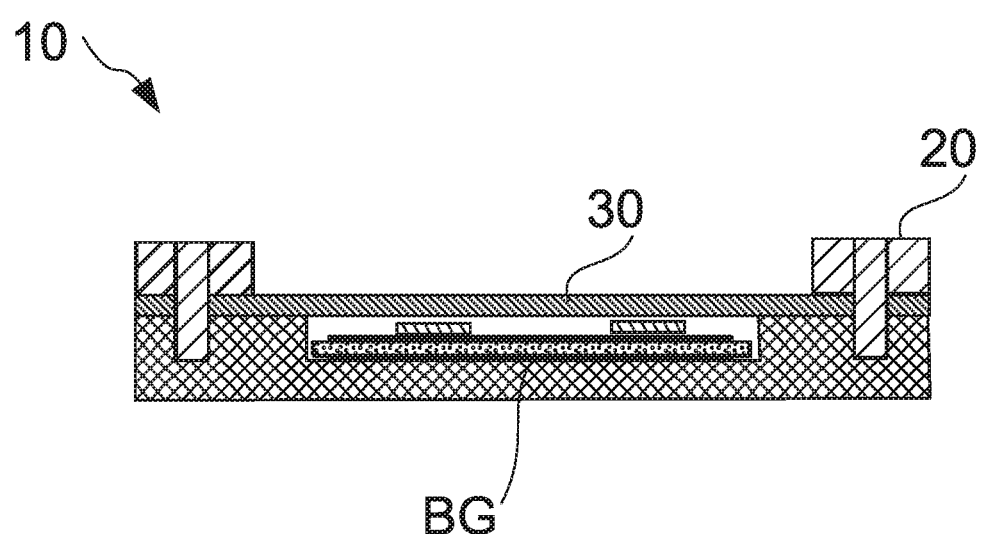
FIG. 1 shows a sectional view through an exemplary embodiment according to the invention that is of a particularly preferred design.

FIG. 1 shows a sintering tool 10, which has a cradle, formed as a depression in the sintering tool 10, for receiving an electronic subassembly BG to be sintered. The electronic subassembly BG is covered by a protective film 30, for example a Teflon film, which is fastened to the sintering tool 10 by means of the support bracket 20 arranged on both sides of the cradle.

Figure 2:
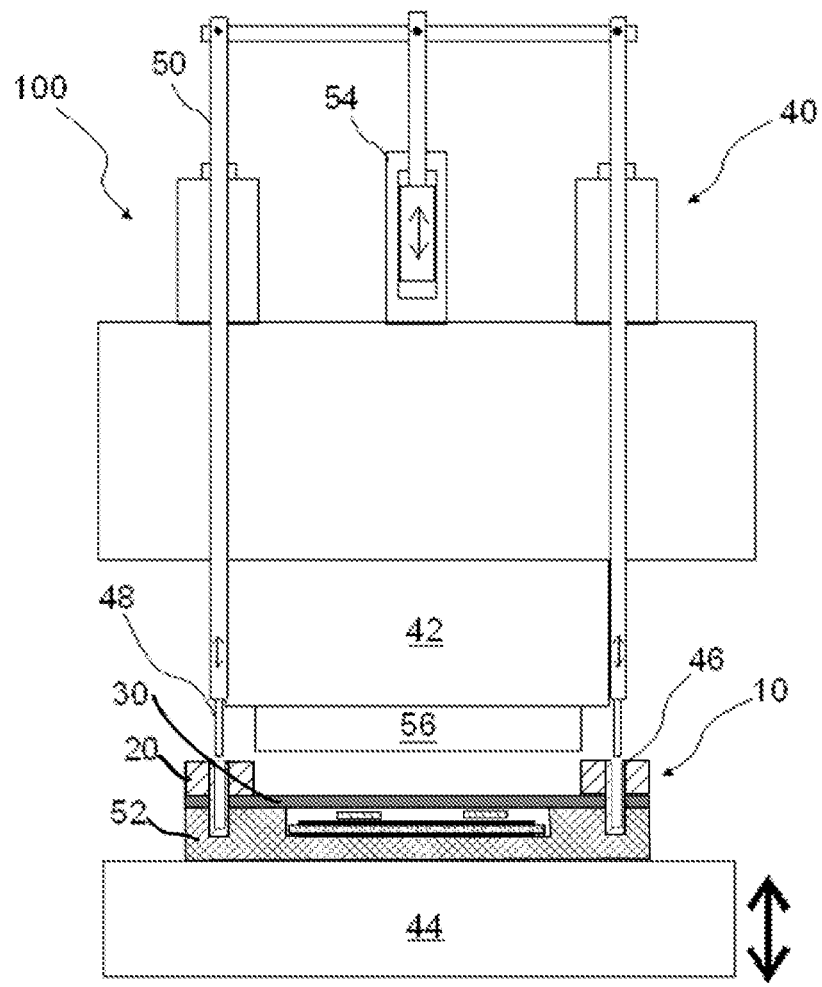
FIG. 2 shows a sectional view through a second exemplary embodiment according to the invention with a release device for the separation of the sintering tool.

In FIG. 2 is shown a sintering press 100 which comprises an upper die 42 and a lower die 44. A sintering tool 10 is mounted on the lower die 44. For pressure sintering, the lower die 44 can be moved vertically in the direction of the upper die 42 to produce a sintering pressure in the range of 10 to 40 MPa. An electronic subassembly BG, comprising a circuit substrate and electronic components which are to be electrically connected to it by pressure sintering, is inserted into a cradle in the tool holder 52. The sintering tool 10 includes a protective film 30 and a support bracket 20, which is formed as an annular clamping ring around the tool holder 52, and the protective film 30 is fixed on the tool holder 52 of the sintering tool 10. The lower die 44 and the upper die 42 are electrically heated. The upper die 42 carries a pressure pad 56, that creates a quasi-hydrostatic pressure distribution on the protective film 30 and the electronic assembly BG when the lower die 44 is pressed into the upper die 42. After the pressure sintering process, the lower die 44 moves downwards away from the upper punch 42. In order to prevent adhesion of the protective film 30, and thus also the sintering tool 10 to the pressure pad 56, receiving sockets 46 are provided in the support bracket 20 of the sintering tool 10. A release device 40 is shown, comprising a lifting bar 50 which is vertically movable by a hydraulic or pneumatic actuator cylinder 54. The lifting bar 50 includes two or more actuator bolts 48 which can engage in the receiving sockets 46 of the support bracket 20. If the lifting bar 50 is lowered in the direction of the closed lower die 44, preferably synchronously with the speed of lowering of the lower die 44, a reliable separation of the protective film 30, and thus the sintering tool 10, from the pressure pad 56 is obtained. Thus the sintering tool 10 can be removed from the sintering press 100 to allow further processing steps.

Figure 3:
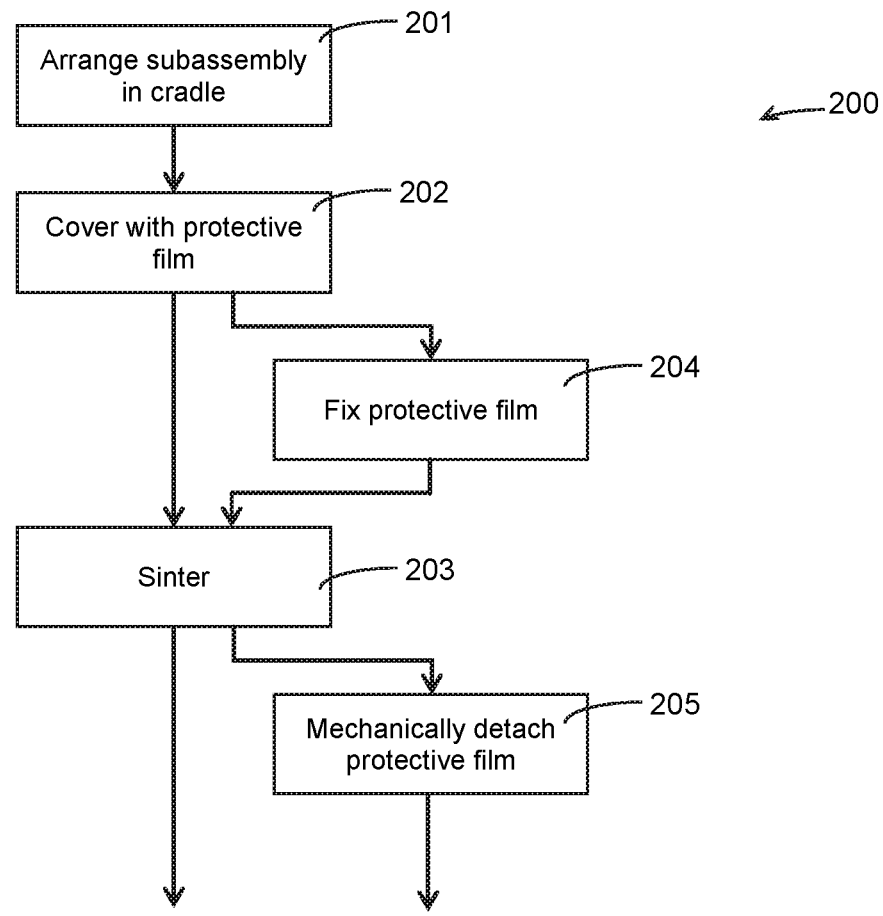
FIG. 3 shows a flow diagram illustrating an exemplary embodiment of the method according to the invention.

FIG. 3 shows a flow diagram illustrating an exemplary embodiment of the method according to the invention. The method 200 concerning the invention for sintering an electronic subassembly provides that the electronic subassembly is arranged 201 on the cradle of a sintering tool, is covered 202 with a protective film, and is sintered 203, the protective film optionally being fixed 204 at least in a direction in front of and behind the electronic subassembly after the covering and before the sintering of the electronic subassembly. Optionally, the protective film may be mechanically detached 205 after sintering 203.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for sintering an electronic subassembly comprising the steps of:

arranging the electronic subassembly on a cradle of a sintering tool;

covering the electronic subassembly with a protective film; and sintering the electronic subassembly;

whereby after the covering and before the sintering of the electronic subassembly, the protective film is fixed to at least one support bracket which is in turn fixed at two locations on opposing sides of the cradle, such that the protective film is clamped between the cradle and the at least one support bracket, and wherein the support bracket has a socket configured to receive a connector associated with an upper die.

2. The method according to claim 1, wherein the protective film is a Teflon film.

3. The method according to claim 1, wherein the protective film is of a multi-layered or multi-ply construction.

4. The method according to claim 3, wherein the one layer or ply of the protective film consists of Teflon and another layer or ply consists of Kapton.

5. The method according to claim 1, wherein the protective film has pores or holes penetrating the protective film and allowing a gas exchange through the protective film.

6. The method according to claim 1, wherein the protective film is mechanically detached from an upper die after the sintering by a release device.

7. The method according to claim 2, wherein the protective film is of a multi-layered or multi-ply construction.

8. The method according to claim 2, wherein the protective film has pores or holes penetrating the protective film and allowing a gas exchange through the protective film.

9. The method according to claim 3, wherein the protective film has pores or holes penetrating the protective film and allowing a gas exchange through the protective film.

10. A method for sintering an electronic subassembly comprising the steps of:
    arranging the electronic subassembly on a cradle of a sintering tool;
    covering the electronic subassembly with a protective film; and
    sintering the electronic subassembly;
    whereby after the covering and before the sintering of the electronic subassembly, the protective film is fixed to at least one support bracket which is in turn fixed at two locations on opposing sides of the cradle, such that the protective film is fixed between the electronic subassembly and a sintering pressure pad and such that the protective film is clamped between the cradle and the at least one support bracket, wherein the at least one support bracket is provided with receiving sockets configured to engage a release device, and wherein the release device is configured to separate the protective film from the sintering pressure pad after the sintering of the electronic subassembly.

11. The method according to claim 10, wherein the receiving sockets are configured to engage a moveable actuator of the release device.

12. A method for sintering an electronic subassembly comprising the steps of:
    arranging the electronic subassembly on a cradle of a sintering tool of a sintering press, the sintering press comprising an upper die and a lower die;
    covering the electronic subassembly with a protective film; and
    sintering the electronic subassembly;
    whereby after the covering and before the sintering of the electronic subassembly, the protective film is fixed to at least one support bracket which is in turn fixed at two locations on opposing sides of the cradle, such that the protective film is clamped between the cradle and the at least one support bracket, and wherein the support bracket has a socket configured to receive a connector associated with the upper die.

13. The method according to claim 12, wherein the sintering press further comprises a pressure pad arranged on the upper die, wherein the sintering tool is arranged on the lower die, wherein the lower die is configured to be moved towards the upper die, and wherein the pressure pad is configured to provide a hydrostatic pressure distribution onto the protective film and the electronic subassembly when the lower die is moved towards the upper die.

14. The method according to claim 12, wherein the sintering press further comprises a release device configured to engage the at least one support bracket and to separate the protective film from a sintering pressure pad after the sintering of the electronic subassembly.

* * * * *